United States Patent
Kim et al.

(10) Patent No.: US 10,049,815 B2
(45) Date of Patent: Aug. 14, 2018

(54) NESTED THROUGH GLASS VIA TRANSFORMER

(71) Applicant: QUALCOMM Incorporated, San Diego, CA (US)

(72) Inventors: Daeik Daniel Kim, Del Mar, CA (US); Jonghae Kim, San Diego, CA (US); Chengjie Zuo, San Diego, CA (US); Mario Francisco Velez, San Diego, CA (US); Changhan Hobie Yun, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 21 days.

(21) Appl. No.: 15/167,782

(22) Filed: May 27, 2016

(65) Prior Publication Data

US 2016/0276101 A1    Sep. 22, 2016

Related U.S. Application Data

(62) Division of application No. 14/155,172, filed on Jan. 14, 2014, now Pat. No. 9,384,883.

(51) Int. Cl.
| | |
|---|---|
| *H01F 41/04* | (2006.01) |
| *H01F 27/28* | (2006.01) |
| *H01F 41/00* | (2006.01) |
| *H01F 17/00* | (2006.01) |

(52) U.S. Cl.
CPC ....... *H01F 41/041* (2013.01); *H01F 27/2804* (2013.01); *H01F 41/00* (2013.01); *H01F 2017/0086* (2013.01); *H01F 2027/2809* (2013.01); *H01L 2924/0002* (2013.01); *Y10T 29/4902* (2015.01)

(58) Field of Classification Search
CPC ....................................................... H01F 41/04
USPC ..... 257/686; 336/200, 232, 223; 361/679.31
See application file for complete search history.

(56) References Cited

U.S. PATENT DOCUMENTS

| | | | |
|---|---|---|---|
| 4,614,878 | A | 9/1986 | Lauchner et al. |
| 5,300,911 | A | 4/1994 | Walters |
| 5,898,991 | A | 5/1999 | Fogel et al. |
| 5,949,030 | A | 9/1999 | Fasano et al. |
| 6,031,445 | A | 2/2000 | Marty et al. |

(Continued)

FOREIGN PATENT DOCUMENTS

| | | |
|---|---|---|
| CN | 103219139 A | 7/2013 |
| EP | 1164113 A1 | 12/2001 |

(Continued)

OTHER PUBLICATIONS

International Search Report and Written Opinion—PCT/US2014/070851—ISA/EPO—dated Apr. 9, 2015.

*Primary Examiner* — Sheng Zhu
(74) *Attorney, Agent, or Firm* — Qualcomm Incorporated/Seyfarth Shaw LLP

(57) ABSTRACT

A 3D nested transformer includes a substrate having a set of through substrate vias daisy chained together with a set of traces. At least some of the through substrate vias have first and second conductive regions. The set of traces also includes a first set of traces coupling together at least some of the first conductive regions of the through substrate vias, and a second set of traces coupling together at least some of the second conductive regions of the through substrate vias.

21 Claims, 12 Drawing Sheets

(56) References Cited

U.S. PATENT DOCUMENTS

| | | | |
|---|---|---|---|
| 6,606,022 | B1 | 8/2003 | Taurand |
| 6,717,071 | B2 | 4/2004 | Chang et al. |
| 6,756,874 | B2 * | 6/2004 | Buckles et al. ............... 336/180 |
| 6,914,509 | B2 * | 7/2005 | Yu et al. ....................... 336/200 |
| 7,170,384 | B2 | 1/2007 | Kim et al. |
| 7,443,263 | B2 | 10/2008 | Gruchalla |
| 7,518,248 | B2 | 4/2009 | Li et al. |
| 7,549,222 | B2 | 6/2009 | Nakamura |
| 7,696,852 | B1 * | 4/2010 | Harding .............. H01F 17/0006 29/602.1 |
| 8,426,743 | B2 | 4/2013 | Corisis et al. |
| 8,508,301 | B2 | 8/2013 | Kim et al. |
| 8,803,648 | B2 | 8/2014 | Lo et al. |
| 2002/0017399 | A1 | 2/2002 | Chang et al. |
| 2007/0194431 | A1 | 8/2007 | Corisis et al. |
| 2010/0284140 | A1 * | 11/2010 | Corisis et al. ........... 361/679.31 |
| 2011/0084765 | A1 | 4/2011 | Kim et al. |
| 2011/0234357 | A1 | 9/2011 | Kim et al. |
| 2013/0293336 | A1 | 11/2013 | Lo et al. |
| 2015/0200049 | A1 | 7/2015 | Kim et al. |

FOREIGN PATENT DOCUMENTS

| | | |
|---|---|---|
| JP | H0738361 A | 2/1995 |
| JP | 2000133520 A | 5/2000 |
| JP | 2001354439 A | 12/2001 |

\* cited by examiner

NESTED THROUGH GLASS VIA TRANSFORMER

CROSS-REFERENCE TO RELATED APPLICATION

The present application is a divisional of U.S. patent application Ser. No. 14/155,172, filed on Jan. 14, 2014, and entitled "NESTED THROUGH GLASS VIA TRANSFORMER," the disclosure of which is expressly incorporated by reference herein in its entirety.

TECHNICAL FIELD

The present disclosure generally relates to integrated circuits (ICs). More specifically, one aspect of the present disclosure relates to a nested through glass via (or through substrate via) transformer.

BACKGROUND

A transformer may be any electronic device that transfers energy by inductive coupling between its winding circuits (e.g., windings). A transformer may include a primary winding and a secondary winding. A current that varies in the primary winding creates a varying magnetic flux in the core of the transformer that creates a varying magnetic flux through the secondary winding. This varying magnetic flux then induces a varying electromotive force (e.g., a voltage) in the secondary winding. Transformers are also used to vary the relative voltage of circuits or isolate voltages altogether. Overall, transformers are used for the distribution, transmission and consumption of electrical energy for a variety of different applications.

SUMMARY

In one aspect of the present disclosure, a 3D nested transformer is disclosed. The 3D nested transformer includes a substrate having a set of through substrate vias daisy chained together with a set of traces. At least some of the through substrate vias have first and second conductive regions. The set of traces includes a first set of traces and a second set of traces. The first set of traces couple together at least some of the first conductive regions of the through substrate vias. The second set of traces couple together at least some of the second conductive regions of the through substrate vias.

Another aspect discloses a 3D nested transformer including a substrate having a set of through substrate vias daisy chained together with a set of traces. At least some of the through substrate vias have first and second means for conducting. The set of traces includes a first set of traces coupling together at least some of the first means for conducting, and a second set of traces coupling together at least some of the second means for conducting.

In another aspect, a method of fabricating a 3D nested transformer is disclosed. The method includes forming a set of through substrate vias in a substrate. The method also includes daisy chaining the through substrate vias together with a set of traces. At least some of the set of through substrate vias have first and second conductive regions. The daisy chaining of the through substrate vias occurs by coupling a first set of traces to at least some of the first conductive regions of the set of through substrate vias, and coupling a second set of traces to at least some of the second conductive regions of the set of through substrate vias.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
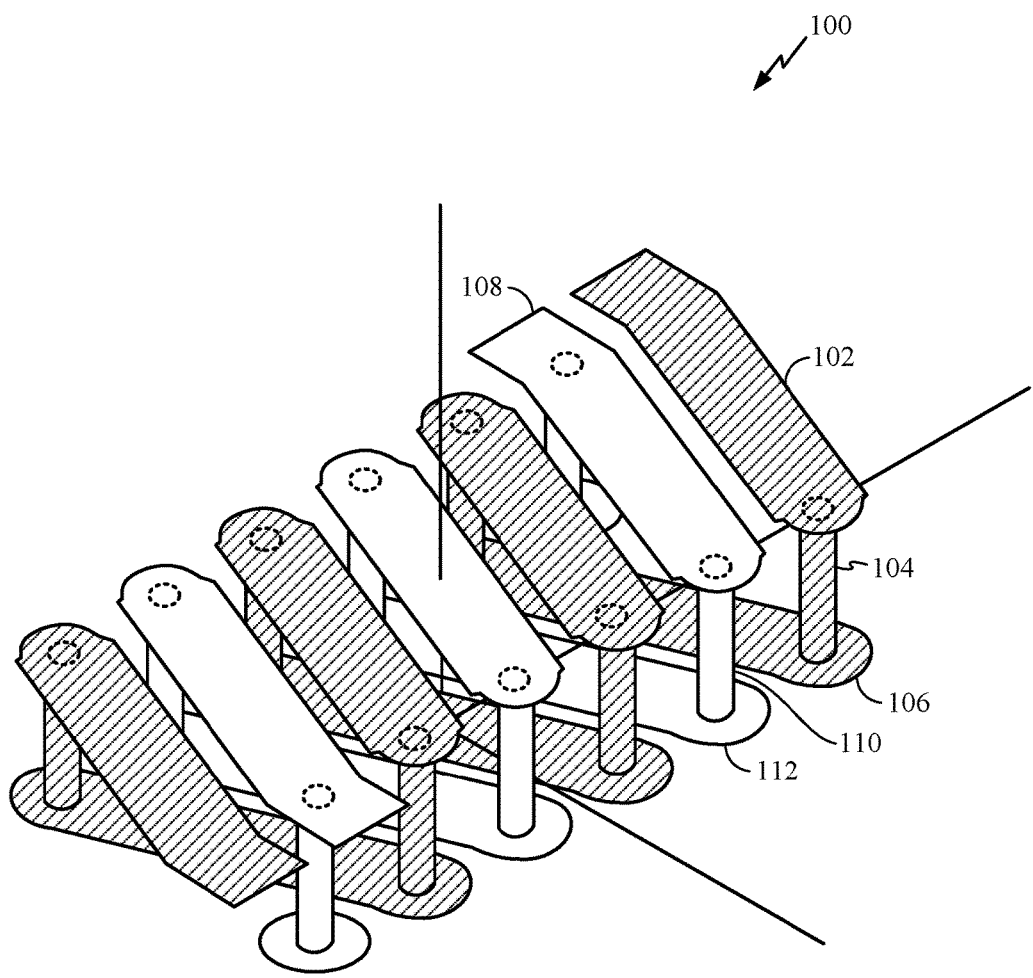
FIG. 1 is a perspective view of a typical transformer design.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Transformers may be fabricated with semiconductor manufacturing processes to provide, for example, two-dimensional (2D) transformers and three-dimensional (3D) transformers. 2D transformers, however, suffer from vertical interference. In addition, conventional 3D transformers, implemented with through glass via (TGV) technology, may consume an extensive area due to the pitch of the TGVs. In such 3D transformers, the coupling efficiency is weak due to the arrangement of inductors in the transformer, which are separated by the TGV pitch. Because the TGV pitch is large, the overall inductor coupling efficiency of the 3D transformers is reduced. The large TGV pitch, however, provides a high quality (or Q) factor for inductors and other components within the 3D transformers.

Fabricating high performance transformers with low area, high coupling efficiency and a strong Q factor is a challenge. A transformer design that achieves high coupling efficiency and a high Q factor while being fabricated in an efficient and economical manner that conserves resources within a reduced area is described.

In one configuration, a three-dimensional (3D) nested transformer design is fabricated in a solenoid configuration within a reduced area, while providing high coupling efficiency and a strong Q factor. The 3D nested transformer may be implemented using through glass vias (TGVs). For example, the TGVs in a 3D nested transformer design may contain conformal-plated layers and a core. The nested transformer may be implemented within a single TGV inductor foot print. Multiple inductors within the 3D nested transformer are also efficiently coupled with a single TGV. As a result, multiple radio frequency (RF) paths are also enabled by the TGVs. The nested transformer also includes TGV inductors having a high Q factor and high coupling efficiency. The high-Q factor TGV inductors may be implemented with the same process technology used to fabricate the 3D nested transformer.

In one aspect, a 3D nested transformer is disclosed that includes a substrate having a set of through substrate vias daisy chained together with a set of traces. In this aspect of the disclosure, some of the through substrate vias have first and second conductive regions. The set of traces may include a first set of traces that couple together some of the first conductive regions of the through substrate vias. The set of traces may also include and a second set of traces that coupling together some of the second conductive regions of the through substrate vias.

FIG. 1 is a perspective view of a typical transformer design 100. The typical transformer design 100 includes a first primary winding plate 102, a second primary winding plate 106, a primary winding support pole 104, a first secondary winding plate 108, a second secondary winding plate 112 and a secondary winding support pole 110. A primary winding is intertwined with a secondary winding. The primary winding includes the first primary winding plate 102, the primary winding support pole 104 and the second primary winding plate 106. The secondary winding includes the first secondary winding plate 108, the second-ary winding support pole 110 and the second secondary winding plate 112. A current that varies in a selected one of the primary winding or the secondary winding creates a varying magnetic flux in the core of the typical transformer design 100, which in turn creates a varying magnetic flux through the other non-selected winding. This varying magnetic flux then induces a varying voltage in the other non-selected winding. The primary winding and the secondary winding can also be viewed as first and second inductors.

The typical transformer design 100 has a number of properties. Its Q or quality factor may range from roughly 60 to 80. Its coupling coefficient (k), a metric that expresses the coupling efficiency throughout the transformer, may range from roughly 0.4 to 0.5. Its area can also be expressed as the largest of a metric, x (or 1x), when compared to other transformer implementations.

The typical transformer design 100, however, has many plates that consume a substantial area. The plates include the first primary winding plate 102, the second primary winding plate 106, the first secondary winding plate 108, and the second secondary winding plate 112. The coupling efficiency of the inductors (e.g., windings) is also low because the inductors are arranged apart from each other, and separated by a through glass via (TGV) pitch. Also, because of the TGV pitch, the Q factor of the inductors is relatively low.

Figure 2:
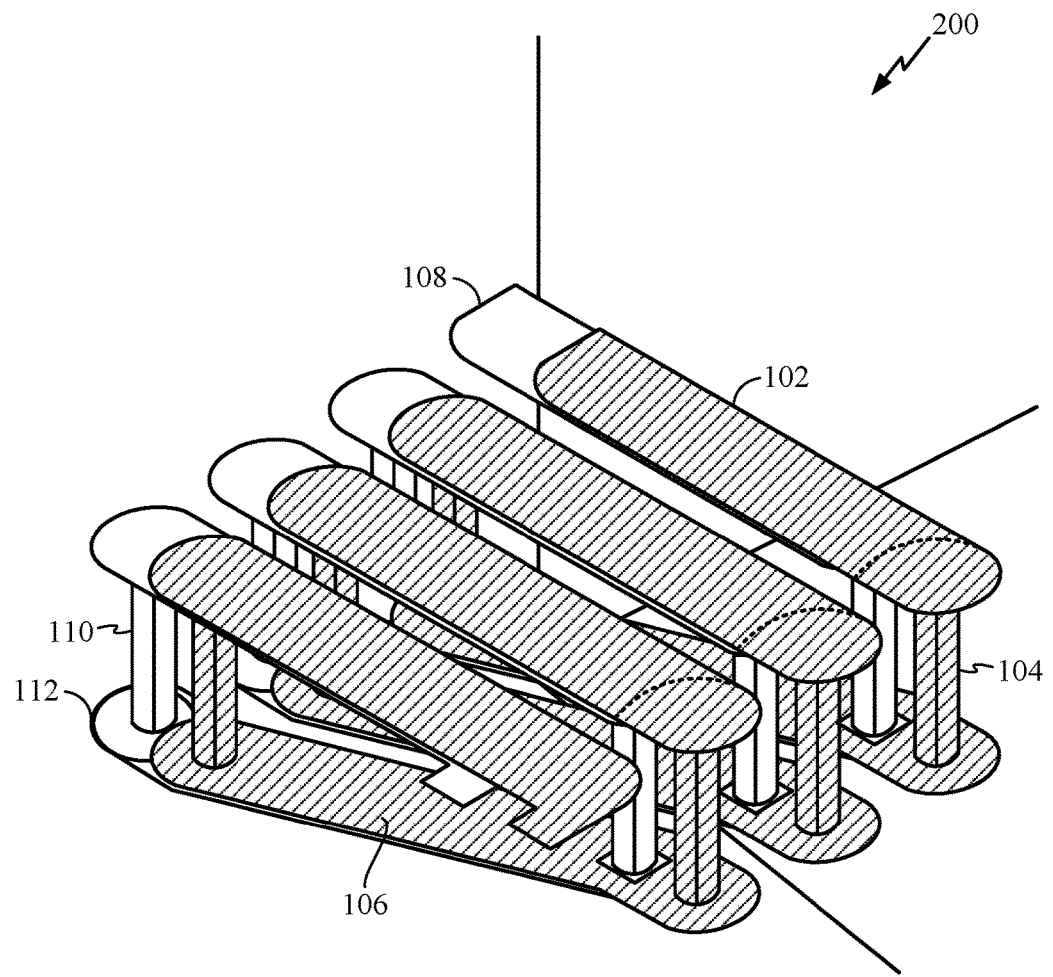
FIG. 2 is a perspective view of another typical transformer design.

FIG. 2 is a perspective view of another typical transformer design 200. The typical transformer design 200 includes the same components as the typical transformer design 100 of FIG. 1. The various components and plates are arranged so that the plates of the primary winding partially overlap the plates of the secondary winding. This approach conserves more area than the typical transformer design 100 of FIG. 1, and may have a slightly higher coupling efficiency, but still is not the most intelligent use of resources for a 3D structure.

In the typical transformer design 200, the Q factor may range from roughly 60 to 80, and the coupling coefficient (k) may range from roughly 0.6 to 0.8. Its area can also be expressed as 0.5x, where x (or 1x) is the metric representing the area of typical transformer design 100.

Figure 3:
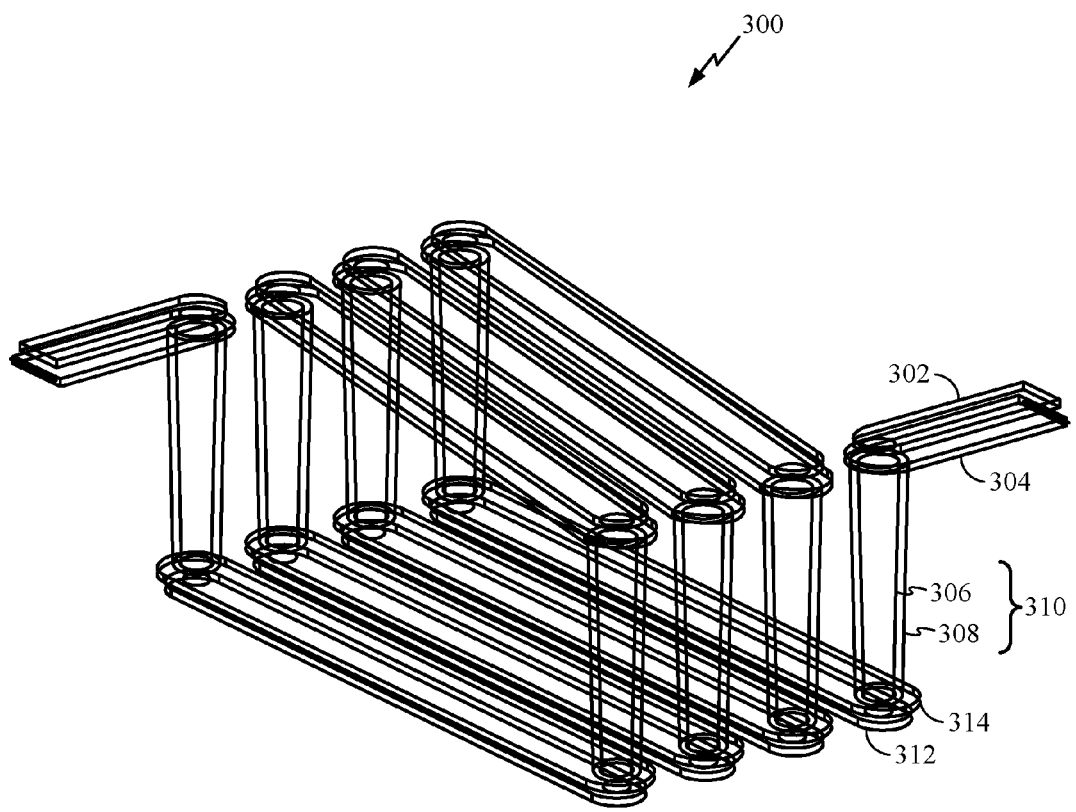
FIG. 3 is a perspective view of a nested transformer design according to an aspect of the present disclosure.

FIG. 3 illustrates a three-dimensional 3D nested transformer design 300 according to an aspect of the present disclosure. The nested transformer design 300 includes a first inner winding plate 302, a second inner winding plate 312, a first outer winding plate 304, a second outer winding plate 314, and a support pole 310 that includes an inner core 306 and an outer shell 308 (or outer filling). The inner winding is intertwined with the outer winding. The inner winding includes the first inner winding plate 302, the inner core 306 and the second inner winding plate 312. The outer winding includes the first outer winding plate 304, the outer shell 308 and the second outer winding plate 314.

The inner winding and the outer winding may cooperate together in a fashion similar to the primary winding and the secondary winding described above in FIGS. 1-2. That is, the inner winding and the outer winding of the 3D nested transformer design 300 combine to perform the functions of a normal transformer while conserving as much area as possible due to a highly space-efficient design. In addition, because the 3D nested transformer design 300 uses space efficiently, there is no through glass via (TGV) pitch issues and the inductors (or outer winding and inner winding) are much closer to one another. Therefore, the coupling efficiency between the inductors is improved, and the Q or quality factor is also improved for both inductors in the nested transformer design 300.

In one configuration, the 3D nested transformer design 300 includes a set of through substrate vias (e.g., the hole where the support pole 310 is formed, to be explained below). In this configuration, the set of through substrate vias are daisy chained together with a set of traces (e.g., the support pole 310 and the various plates 302, 312, 304 and 314). The through substrate vias may also be coaxial vias. The through substrate vias may be arranged in a solenoid configuration. In one configuration, three connections (e.g., between the various plates 302, 312, 304 and 314 and the support pole 310) may be placed within a through substrate via.

In one configuration, there may be a first set of traces and a second set of traces on opposing first and second surfaces of a substrate, and coupled together by a set of through substrate vias in a serpentine manner. The first set of traces are on opposing first and second surfaces of the substrate and the second set of traces are on the first set of conductive traces. In this configuration, the first set of traces and the first conductive regions (e.g., the inner core 306 or the outer shell 308) of the through substrate via are arranged as a first 3D solenoid inductor. The second set of traces and the second conductive regions (e.g., the other of the inner core 306 or the outer shell 308) of the through substrate via are arranged as a second 3D solenoid inductor. The second 3D solenoid inductor is nested with the first 3D solenoid inductor to operate as a nested 3D transformer.

In this configuration, a Q factor of the 3D nested transformer design 300 may range from roughly 60 to 80 or higher. In addition, the coupling coefficient (k) of the 3D nested transformer design 300 may range from roughly 0.8 to 1.0, in the case of passive coupling, for example. The area of the 3D nested transformer design 300 may also be expressed as 0.2x to 0.4x, where x (or 1x) represents the area of typical transformer design 100.

Figure 4A:
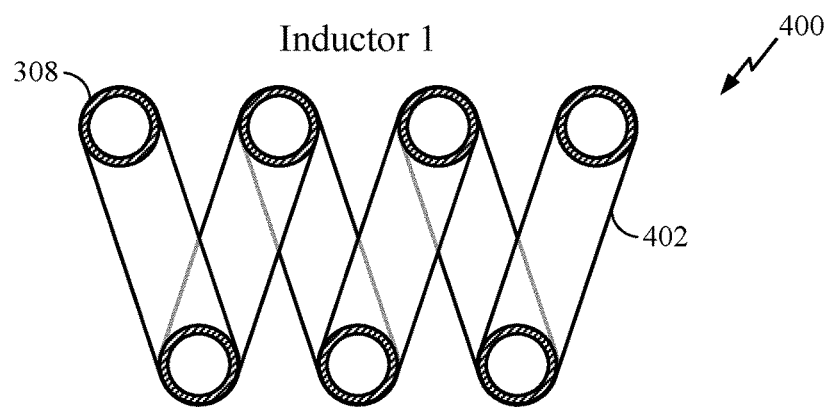
FIGS. 4A-4C are top views of a first inductor, a second inductor, and the first and second inductor combined into a nested transformer design according to an aspect of the present disclosure.
Figure 4B:
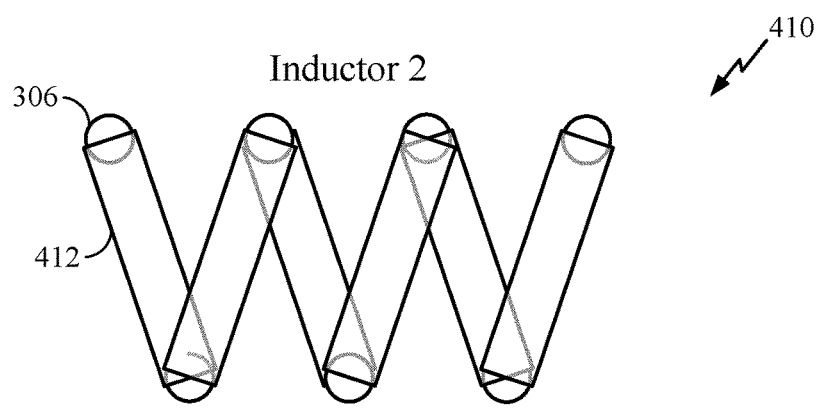
Figure 4C:
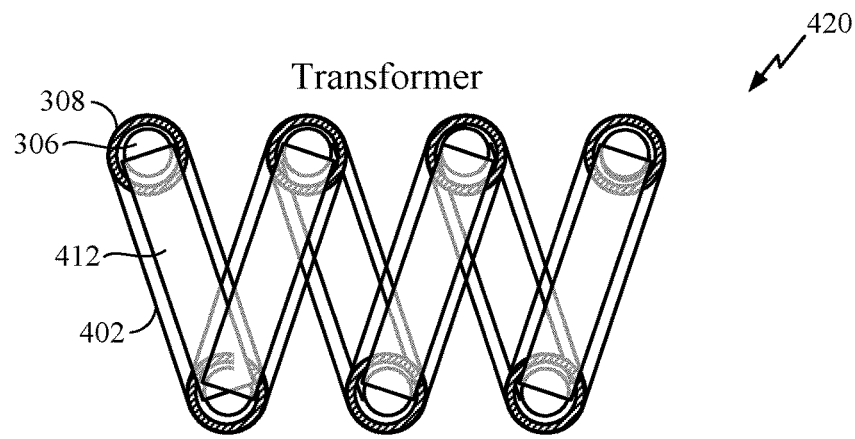

FIGS. 4A-4C are top views of a 3D nested transformer design according to aspects of the present disclosure. In this configuration, a first inductor 400 and a second inductor 410 are nested together to form the 3D nested transformer design.

FIG. 4A shows the first inductor 400. The first inductor 400 may be implemented using the first outer winding plate 304, the second outer winding plate 314 and the outer shell 308, as shown in the nested transformer design 300 of FIG. 3. The first inductor 400 includes the outer shell 308 and a first inductor plate 402. The first inductor plate 402 may be implemented using either the first outer winding plate 304 or the second outer winding plate 314, depending on a direction of view (e.g., top or bottom).

FIG. 4B shows the second inductor 410. The second inductor 410 may be implemented using first inner winding plate 302, the second inner winding plate 312 and the inner core 306, as shown in the nested transformer design 300 of FIG. 3. The second inductor 410 includes the inner core 306 and a second inductor plate 412. The second inductor plate 412 may be implemented using either the first inner winding plate 302 or the second inner winding plate 312, depending on direction of view (e.g., top or bottom).

FIG. 4C shows the nested transformer 420, which combines the first inductor 400 and the second inductor 410 into one transformer. As shown in FIG. 4C, the inner core 306 of the second inductor 410 fits within the outer shell 308 of the first inductor 400. Furthermore, the second inductor plate 412 is smaller than, and has a smaller width than the first inductor plate 402. The sizing of the first inductor plate 402 and the second inductor plate 412, however, is not limited to what is shown in FIG. 4C. For example, the second inductor plate 412 may be larger than, and have a larger width than the first inductor plate 402, even though this implementation is not shown in FIG. 4C. By arranging the first inductor 400 and the second inductor 410 directly on top of one another, space is used efficiently and area is conserved in the design of the 3D nested transformer 420. The 3D nested transformer 420 also includes a set of through substrate vias (e.g., the holes in the outer shells 308, which may be coaxial vias). In this configuration, the set of through substrate vias are daisy chained together with a set of traces (e.g., the inner core 306, and the plates 402 and 412).

Figure 5:
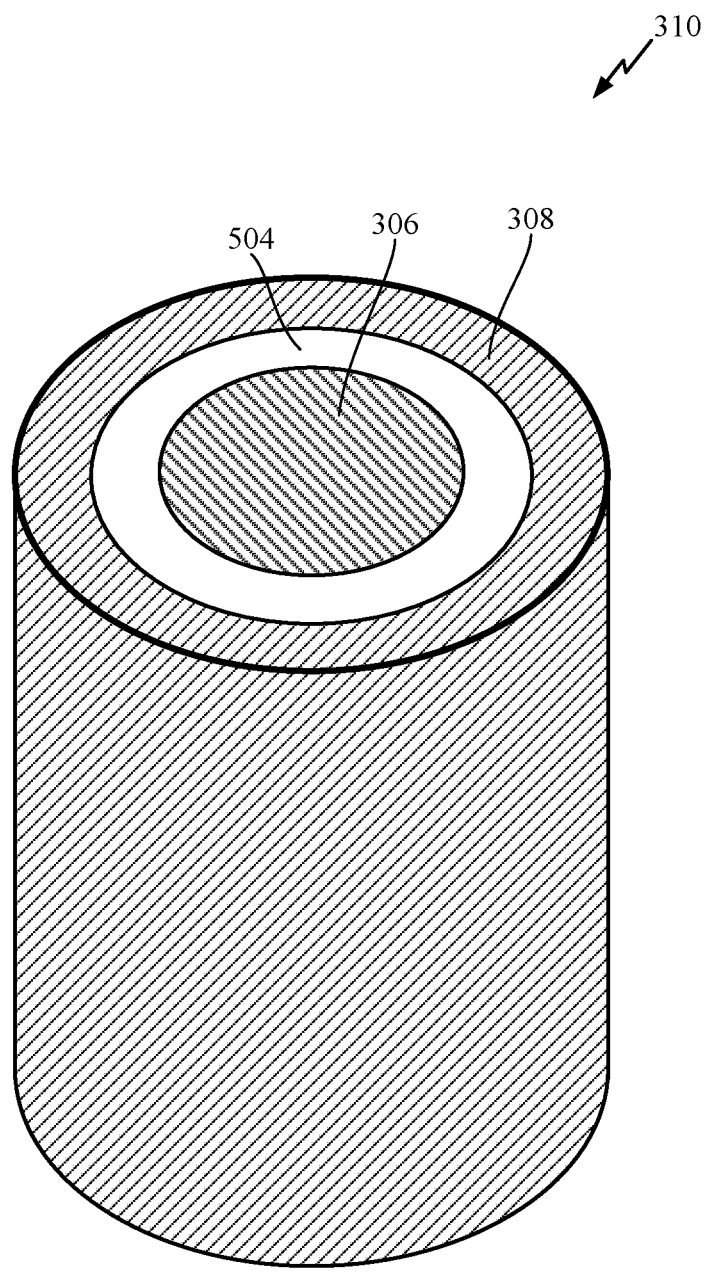
FIG. 5 is a perspective view of a support pole used in a nested transformer design according to an aspect of the present disclosure.

FIG. 5 is a perspective view of a support pole 310 used in a 3D nested transformer design according to an aspect of the present disclosure. The support pole 310 includes the outer shell 308 (or outer filling), the inner core 306, and an isolation layer perspective view, which may be a hollow space filled with air or some other type of material (e.g., an interlayer dielectric material).

In this configuration, a through glass via (TGV) (or through glass hole) may undergo conformal plating in order to form the outer shell 308. Therefore, the isolation layer perspective view is also formed in a conformal manner. The core area may then be filled with solid material to form the inner core 306. The outer shell 308 and the inner core 306 may be made of copper (Cu), or other conductive materials with high conductivity such as silver (Ag), gold (Au), aluminum (Al), tungsten (W), nickel (Ni), and other like materials. The outer shell 308 and the inner core 306 provide two efficient radio frequency (RF) signal paths for the nested transformer. When used in a nested transformer design, the through substrate via may be the hole in which the inner core 306 material is placed. Alternatively, the hole including the isolation layer perspective view and the hole that results if the inner core 306 material may be removed.

Figure 6A:
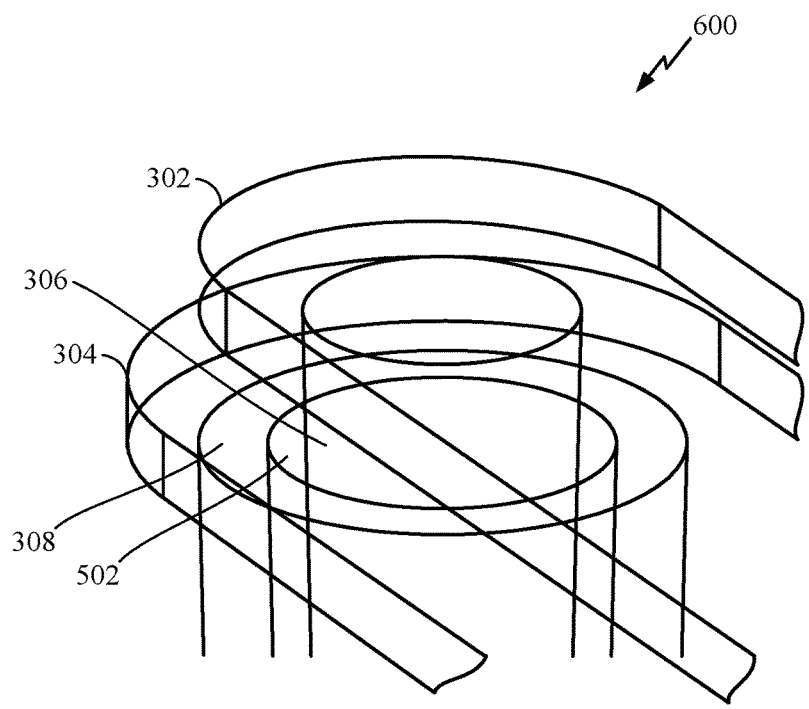
FIGS. 6A-6B are views of the inductor plates and the support pole layers of a nested transformer design according to an aspect of the present disclosure.
Figure 6B:
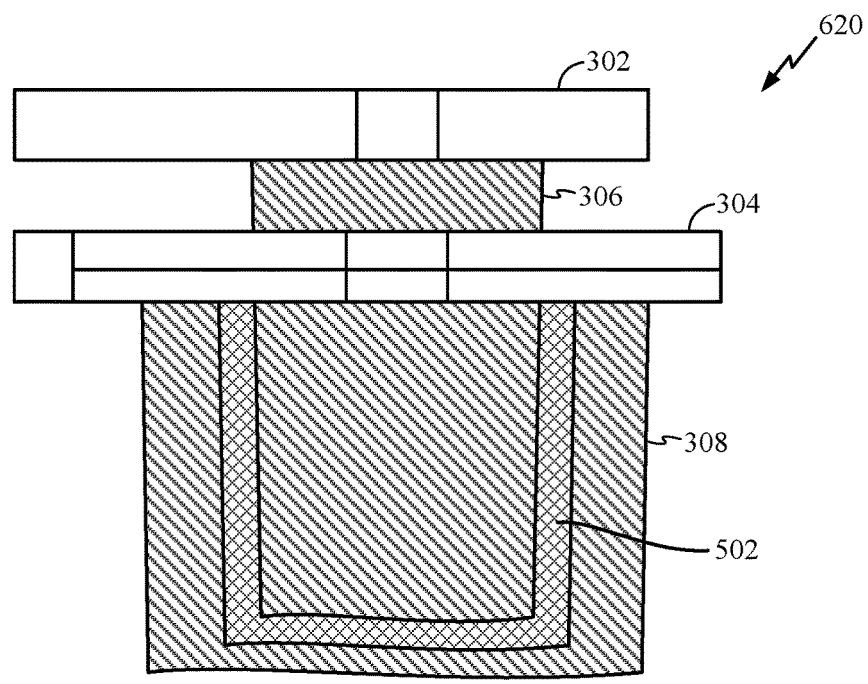

FIGS. 6A-6B illustrate a perspective view 600 and a side view 620 of the inductor plates and the support pole layers of a nested transformer design according to an aspect of the present disclosure.

In FIG. 6A, the perspective view 600 shows the first inner winding plate 302 coupled to the inner core 306, and the first outer winding plate 304 coupled to the outer shell 308. The isolation layer perspective view can also be seen separating the inner core 306 and the outer shell 308.

In FIG. 6B, the side view 620 more clearly shows the first inner winding plate 302 being coupled to the inner core 306 and the first outer winding plate 304 being coupled to the outer shell 308. The isolation layer perspective view can also be seen separating the inner core 306 from the outer shell 308.

Although not shown in FIGS. 6A-6B, the second inner winding plate 312 and the second outer winding plate 314 may be similar as that shown in FIGS. 6A-6B when flipped upside down. That is, the second inner winding plate 312 would be at the very bottom (and most exterior side), and the second outer winding plate 314 would be slightly higher than the position of the second inner winding plate 312.

Also shown in FIGS. 6A-6B is a transformer design that has a set of through substrate vias (e.g., the hole containing the isolation layer 502 and the inner core 306). The through substrate vias may be daisy chained together with a set of traces (the plates 302, 304, or regions coupled to the inner core 306 or the outer shell 308). In one configuration, the first set of traces and the second set of traces are separated by a dielectric layer (e.g., the isolation layer 502).

Figure 7:
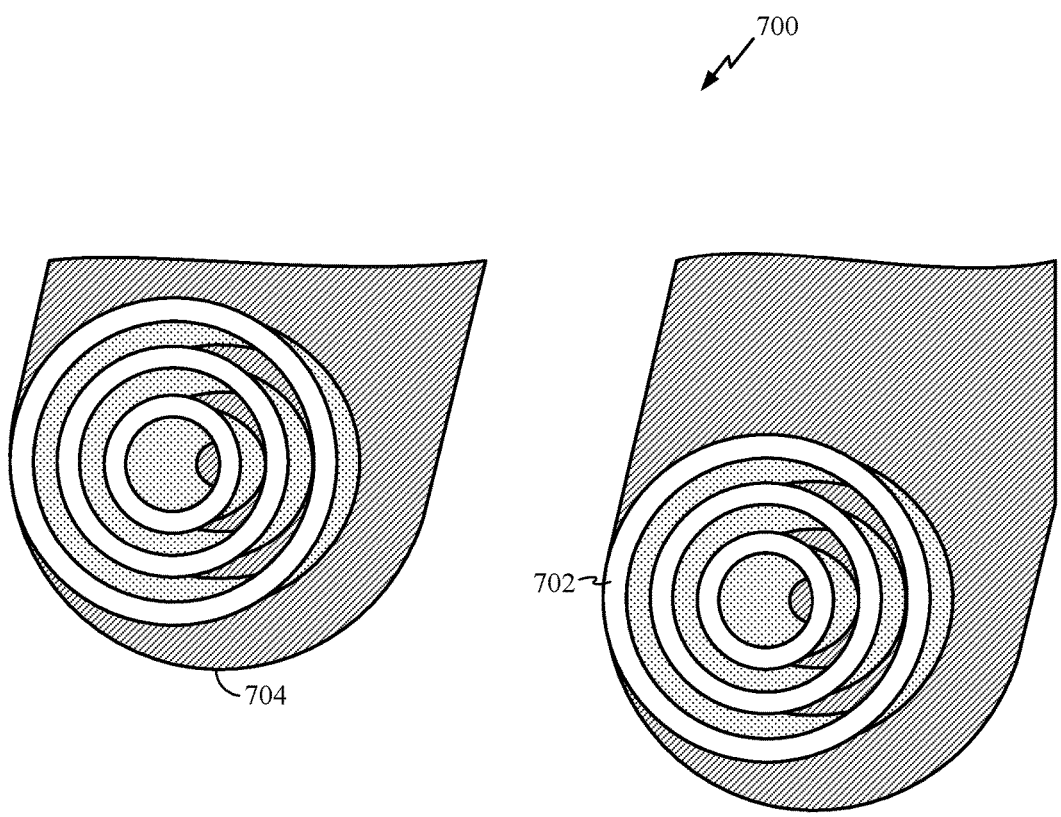
FIG. 7 is a perspective view of bottom plates of a nested transformer design according to an aspect of the present disclosure.

FIG. 7 is a perspective view 700 of bottom plates of a 3D nested transformer design according to an aspect of the present disclosure. The perspective view 700 includes a plate 704 and layered rings 702. The plate 704 may be the first inner winding plate 302, the second inner winding plate 312, the first outer winding plate 304 or the second outer winding plate 314. The layered rings 702 represent the potential layers of nested inductors that can be placed within a nested transformer structure. Whereas FIGS. 6A-6B only show one inductor (the inner winding) associated with the inner core 306, the inner core 306 can be further divided into concentrically smaller inner cores (or further through substrate vias), each inner core having a corresponding inductor. Therefore, a number of inductors may be placed within a nested transformer design, space and resources permitting. The nested transformer design, however, allows the inclusion of more inductors within a compact and space-efficient design while reducing area and improving coupling efficiency and the collective inductor Q factor.

FIGS. 8A-8H are side views 800-880 illustrating a method of making a nested transformer design according to an aspect of the present disclosure.

Figure 8A:
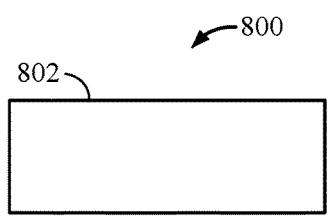
FIGS. 8A-8H are side views illustrating a method of making a nested transformer design according to an aspect of the present disclosure.

In FIG. 8A, a side view 800 shows a substrate 802. The substrate 802 may be made of glass or other materials such as silicon (Si), Gallium Arsenide (GaAs), Indium Phosphide (InP) Silicon Carbide (SiC), Sapphire (Al2O3), Quartz, Silicon on Insulator (SOI), Silicon on Sapphire (SOS), High Resistivity Silicon (HRS), Aluminum Nitride (AlN), a plastic substrate, a laminate, or a combination thereof.

Figure 8B:
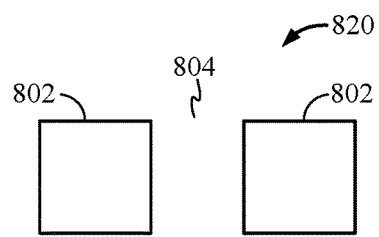

In FIG. 8B, a side view 820 shows a hole 804 that is formed in the substrate 802. The hole may be formed by drilling or an etching process using photolithography masks and photoresist. The etching processes may be either a dry etching process using plasmas or a wet chemical etching process.

Figure 8C:
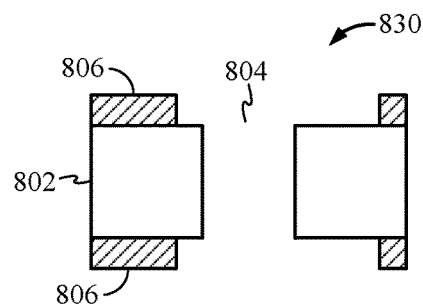

In FIG. 8C, a side view 830 shows a patterned first photoresist layer 806 that is deposited on multiple surfaces of the substrate 802. The patterned first photoresist layer 806 is formed by depositing a first photoresist layer, exposing it, and then patterning it through a photolithography mask by etching away the exposed portions. The patterned first photoresist layer 806 that results is used as a guideline for the conformal plating step that occurs in FIG. 8D. The first photoresist layer may be deposited by spin-coating, droplet-based photoresist deposition, and/or spraying. The first photoresist layer may also be exposed and then etched by chemical etching processes using solutions such as photoresist developer, which may be made of, for example, Tetramethylammonium Hydroxide (TMAH), Iron Chloride (FeCl$_3$), Cupric Chloride (CuCl$_2$) or Alkaline Ammonia (NH$_3$), in order to wash away the exposed photoresist portions. Dry etching processes using plasmas may also be used to etch the first photoresist layer.

Figure 8D:
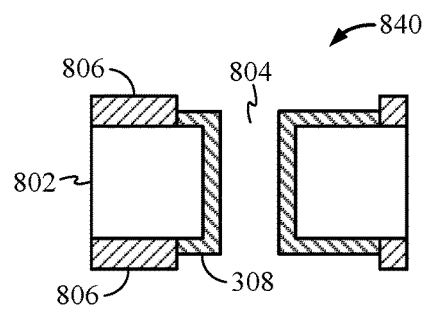

In FIG. 8D, a side view 840 shows the outer shell 308 being deposited onto the sidewalls of the hole 804 and portions of the surfaces of the substrate 802 by conformal plating. The patterned first photoresist layer 806 is used as a guideline for the conformal plating. The outer shell 308 may also be deposited by electroplating, chemical vapor deposition (CVD), and/or physical vapor deposition (PVD), such as sputtering or evaporation. The outer shell 308 may be made of copper (Cu), or other conductive materials with high conductivity such as silver (Ag), gold (Au), aluminum (Al), tungsten (W), nickel (Ni), and other like materials. The patterned first photoresist layer 806 is then stripped (not shown). The patterned first photoresist layer 806 may be stripped by a chemical photoresist stripping process using a photoresist stripper such as, for example, Positive Resist Stripper (PRS-2000), N-Methyl-2-Pyrrolidone (NMP), or Acetone. Photoresist layers may also be stripped by a dry photoresist stripping process using plasmas such as oxygen, which is known as ashing.

Figure 8E:
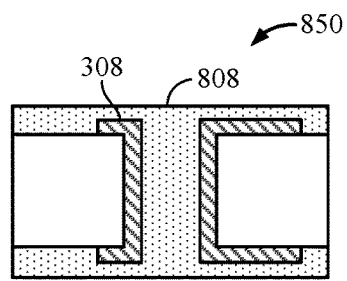

In FIG. 8E, a side view 850 shows a layer of isolation layer material 808 being deposited on the plated regions of the outer shell 308, also filling up the hole 804 in the process. The isolation layer material 808 may be an interlayer dielectric material deposited by a spin-coating process, chemical vapor deposition (CVD), physical vapor deposition (PVD), sputtering, and/or evaporation. If the isolation layer material 808 is an interlayer dielectric material, then it may be made of PVD or CVD oxide, such as Silicon Dioxide (SiO$_2$). To reduce the parasitic capacitance of a high Q inductor, materials having a low k, or a low dielectric constant value, are preferred for the interlayer dielectric material of the isolation layer material 808, such as doped Silicon Dioxide (SiO$_2$), or its Fluorine-doped, Carbon-doped, porous and porous Carbon-doped forms, as well as spin-on organic polymeric dielectrics such as polyimide (PI), polynorbornenes, benzocyclobutene (BCB), polytetrafluoroethylene (PTFE) and spin-on silicone based polymeric dielectrics. In one configuration, the isolation layer material 808 may be a substance that becomes air later on, or is removed to leave air in its place. In another configuration, the isolation layer material 808 may be a material that closely resembles air or another hollow material.

Figure 8F:
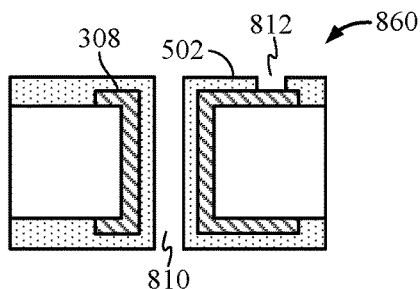

In FIG. 8F, a side view 860 shows a patterned isolation layer 502, having a pattern 812 also formed within it. The isolation layer 502 is formed when the isolation layer material 808 is exposed through a photolithography mask and then etched. Also formed is a core hole 810. The core hole 810 may be where the inner core 306 is positioned. The pattern 812 may also be where part of the material making up the inner core 306 may be deposited. The isolation layer 502 also serves as a barrier between the outer shell 308 and the inner core 306.

Figure 8G:
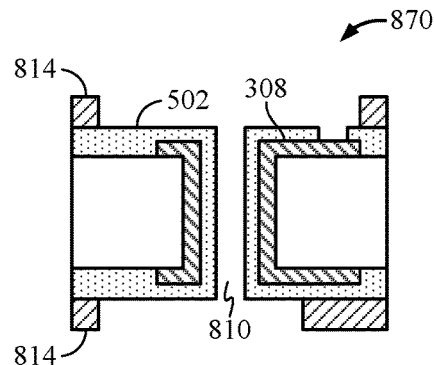

In FIG. 8G, a side view 870 shows a patterned second photoresist layer 814 deposited on the patterned isolation layer 502. The patterned second photoresist layer 814 is formed when a second photoresist layer is deposited on the patterned isolation layer 502, then exposed through a photolithography mask, and then patterned when the exposed portions are etched away. The patterned second photoresist layer 814 is used as a guideline for the depositing or plating of the inner core 306, which occurs in FIG. 8H.

Figure 8H:
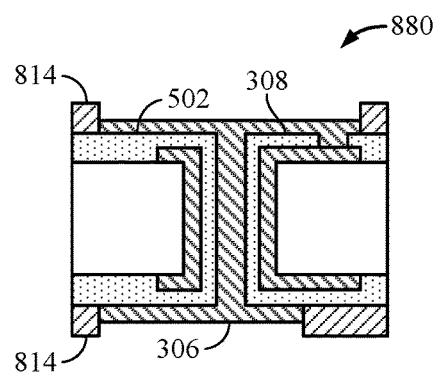

In FIG. 8H, a side view 880 shows a layer of inner core 306 material deposited over the patterned isolation layer 502 using the patterned second photoresist layer 814 as a guideline. The core hole 810 is filled up with inner core material as well. Therefore, what results is the inner core 306 being the core of the transformer, followed by an isolation layer 502 that separates the inner core 306 from the outer shell 308, and then finally an outer shell 308 formed on the exterior of a transformer.

After the vias are fabricated, traces can be deposited to connect the inner vias and the outer vias. Dielectric material can be deposited on the first trace, for example for the outer via, before depositing the conductive material for the other trace (e.g., for the inner via.)

Later processing includes stripping the patterned second photoresist layer 814 and also possibly removing the substrate 802. The substrate 802 may also be kept to preserve the structure of the nested transformer. Other steps also possibly include patterning the inner core 306 further. The layer of the inner core 306 material contacting the top surface of the isolation layer 502 may be further patterned, for example. Also, "additional inner cores" may be added within the inner core 306 in order to add more inductors to the nested transformer structure. Each additional inner core may be created by forming another core hole within the inner core material, the depositing and patterning of another isolation layer, and the depositing and patterning of further inner core material to be placed in that newly-patterned core hole to ultimately form another inductor.

Figure 9A:
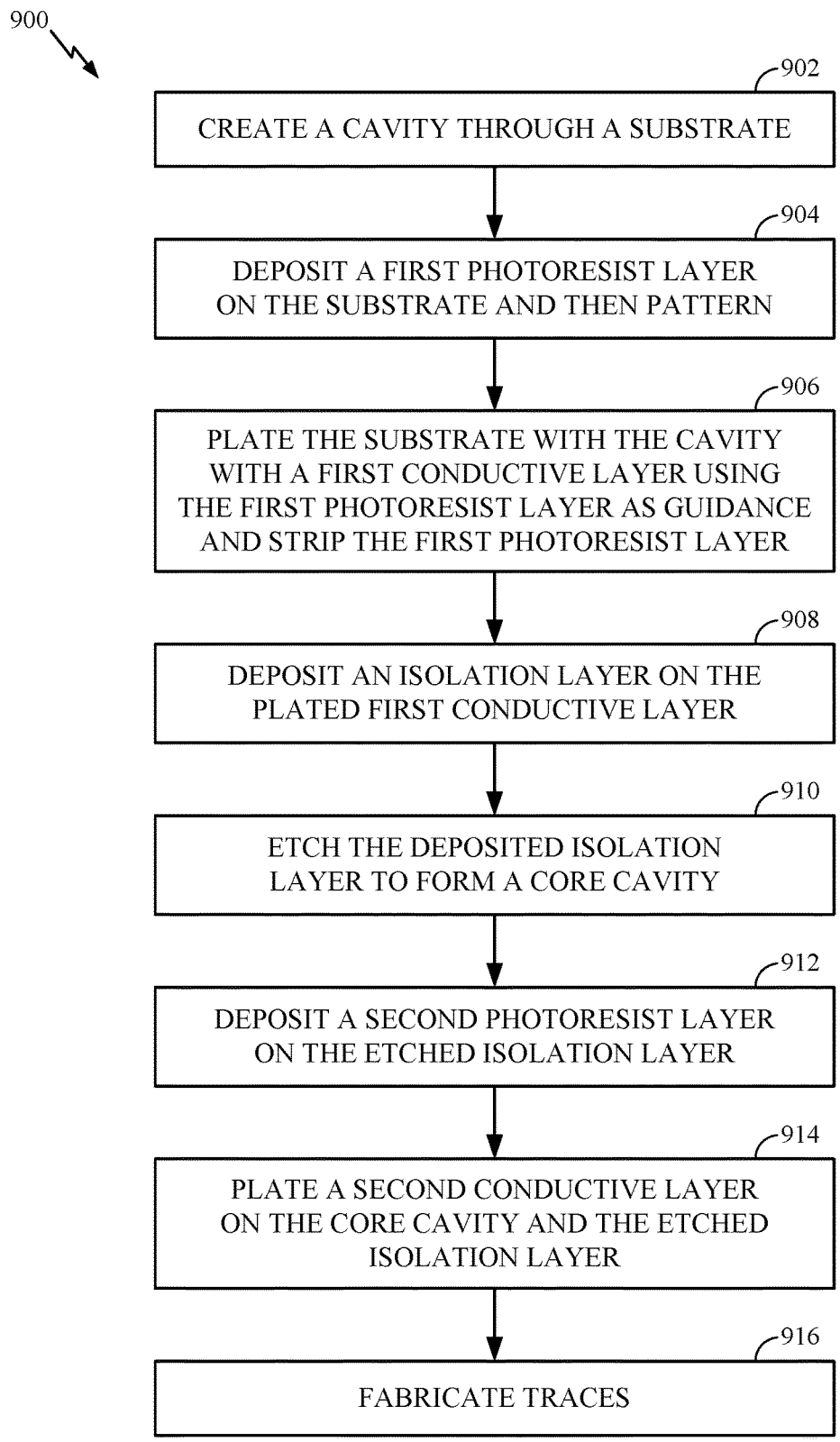
FIG. 9A is a process flow diagram illustrating a method of making a nested transformer design according to an aspect of the present disclosure.

FIG. 9A is a process flow diagram illustrating a method 900 of fabricating a 3D nested transformer design according to an aspect of the present disclosure. Reference is also made to various reference characters of components in side views 800-880 of FIGS. 8A-8H above. In block 902, a cavity (e.g., the hole 804) is formed in a substrate (e.g., the substrate 802). In block 904, a first photoresist layer (e.g., the patterned first photoresist layer 806) is deposited on the substrate and then patterned. In block 906, the substrate and the sidewalls of the cavity are plated with a first conductive layer (e.g., the outer shell 308) using the first photoresist layer as a guide. The first photoresist layer is then stripped. In block 908, an isolation layer (e.g., isolation layer material 808) is deposited on the plated first conductive layer (e.g., the outer shell 308) in the cavity. In block 910, the deposited isolation layer is etched to form a core cavity (e.g., the core hole 810). In block 912, a second photoresist layer (e.g., the patterned second photoresist layer 814) is deposited on the etched isolation layer (e.g., isolation layer 502) and then patterned. In block 914, the core cavity and the etched isolation layer are plated with a second conductive layer (e.g., the inner core 306) using the second photoresist layer as a guide. The second photoresist layer is then stripped. In block 916, the traces (e.g., plates 302, 312, 304 and 314) are fabricated. In one configuration, a dielectric material is provided between the upper and lower traces. Although blocks are shown in a particular sequence, the present disclosure is not so limited.

Figure 9B:
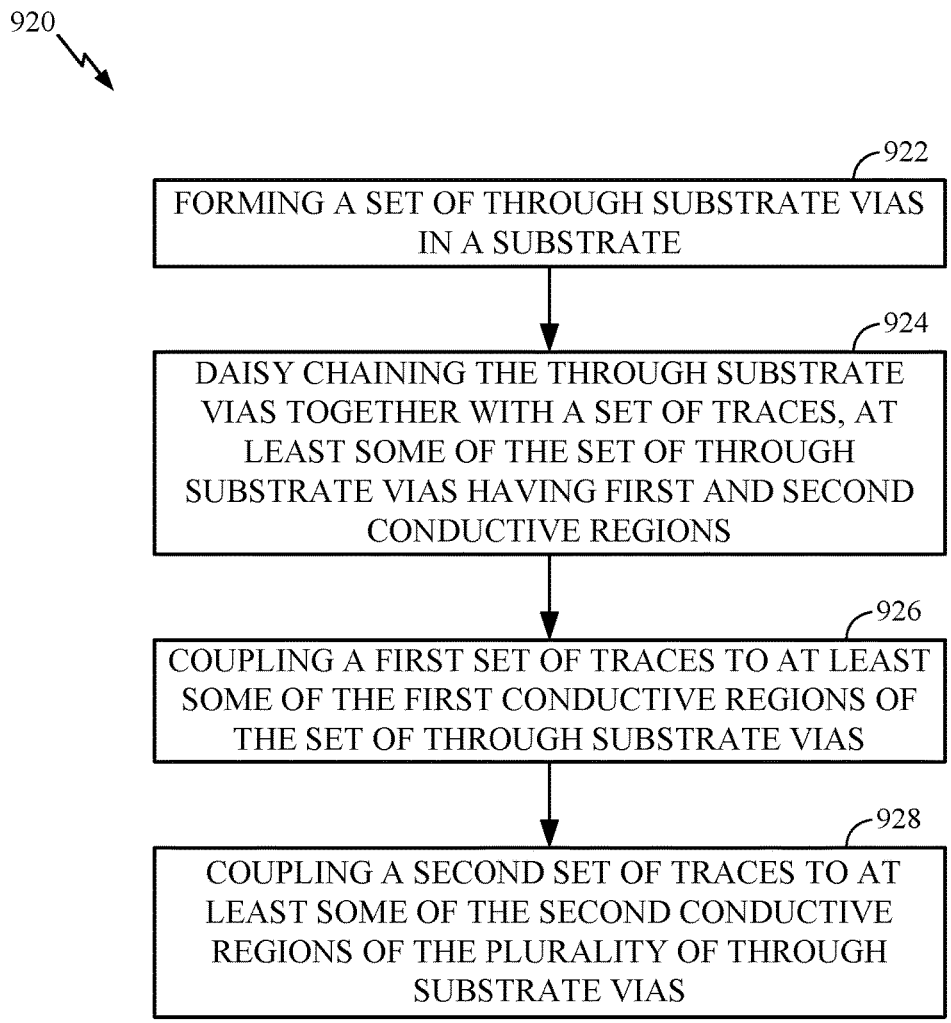
FIG. 9B is a process flow diagram illustrating another method of making a nested transformer design according to an aspect of the present disclosure.

FIG. 9B is a process flow diagram illustrating a method 920 of fabricating a 3D nested transformer design according to an aspect of the present disclosure. Reference is also made to various reference characters of components in side views 800-880 of FIGS. 8A-8H above. In block 922, a set of through substrate vias (e.g., the hole 804) is formed in a substrate (e.g., the substrate 802). In block 924, the through substrate vias are daisy chained together with a set of traces. At least some of the set of through substrate vias have first and second conductive regions (e.g., the first conductive region being the inner core 306 and the second conductive region being the outer shell 308). The through substrate vias are daisy chained together with the set of traces in blocks 926 and 928. In block 926, a first set of traces (e.g., the first inner winding plate 302 and the second inner winding plate 312) are coupled to at least some of the first conductive regions of the set of through substrate vias. In block 928, a second set of traces (e.g., the first outer winding plate 304 and the second outer winding plate 314) are coupled to at least some of the second conductive regions of the set of through substrate vias. The first and second conductive regions and the first and second traces may also switch places. Although blocks are shown in a particular sequence, the present disclosure is not so limited.

In one aspect, a 3D nested transformer is disclosed including a substrate having a set of through substrate vias (e.g., the core hole 810, the hole 804) daisy chained together with a set of traces (e.g., the support pole 310 and the various plates 302, 312, 304 and 314). At least some of the through substrate vias have a first means for conducting and a second means for conducting. The set of traces includes a first set of traces coupling together at least some of the first conducting means of the through substrate vias. The set of traces also includes a second set of traces coupling together at least some of the second conducting means of the through substrate vias. In one configuration, the first conducting means is the inner core 306 and the second conducting means is the outer shell 308, or vice-versa. In another configuration, the first means for conducting is the first inner winding plate 302 and the second inner winding plate 312 coupled to and/or including the inner core 306. In this configuration, the second conducting means is the first outer winding plate 304 and the second outer winding plate 314 coupled to and/or including the outer shell 308. In another aspect, the aforementioned means may be any device configured to perform the functions recited by the aforementioned means.

In one configuration, the substrate is glass. Glass may have the advantage of having low loss properties, or having a low loss tangent, which means that less loss and/or dissipation of electromagnetic energy occurs at RF frequencies. Glass may also have a low dielectric constant, which means less parasitic capacitance. Glass may also be an inexpensive material, having low fabrication costs compared to printed circuit boards (PCBs), and may also be readily available in terms of manufacturing materials.

Figure 10:
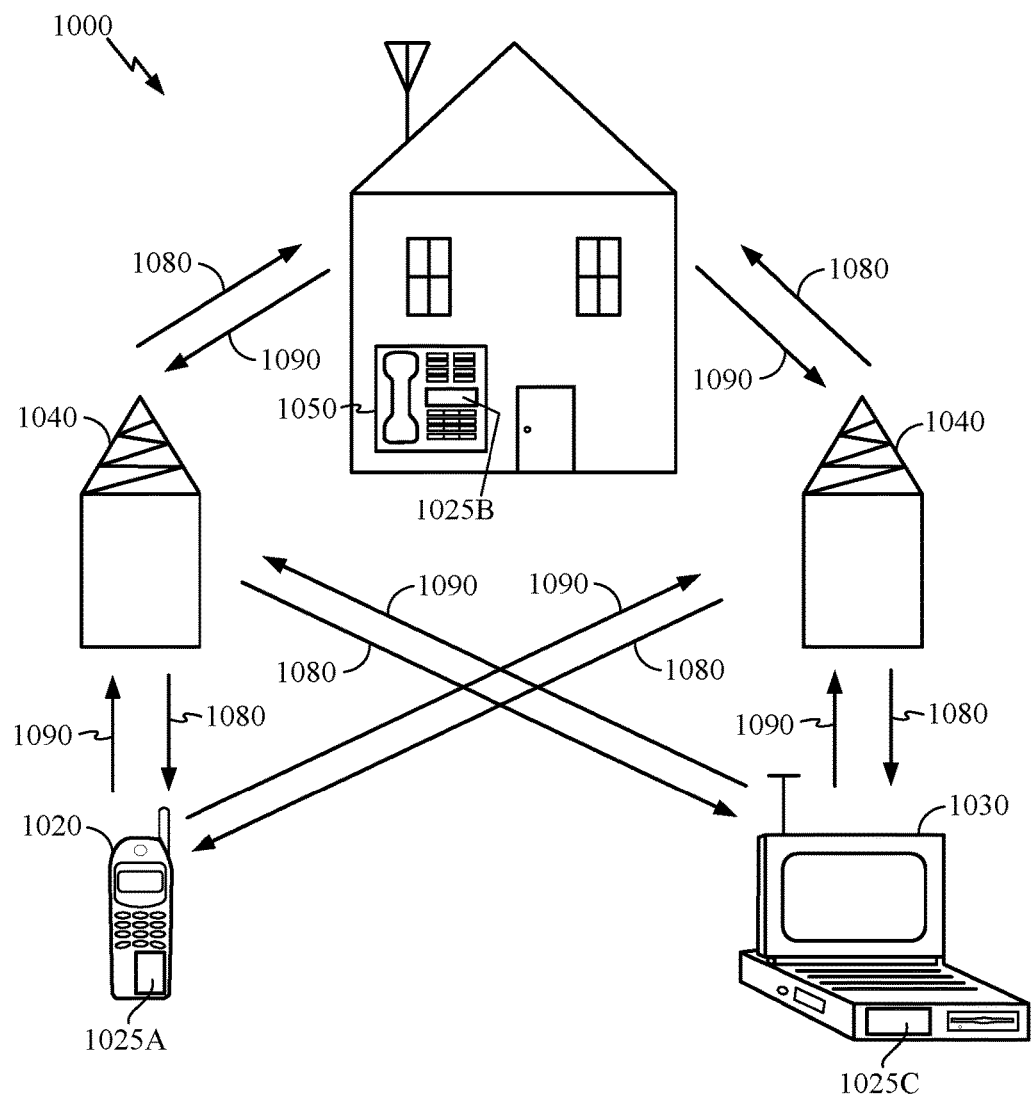
FIG. 10 is a block diagram showing an exemplary wireless communication system in which a configuration of the disclosure may be advantageously employed.

FIG. 10 is a block diagram showing an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C, and 1025B that include the disclosed nested transformer devices. It will be recognized that other devices may also include the disclosed nested transformer devices, such as the base stations, switching devices, and network equipment. FIG. 10 shows forward link signals 1080 from the two base stations 1040 to the remote units 1020, 1030, and 1050 and reverse link signals 1090 from the remote units 1020, 1030, and 1050 to the two base stations 1040.

In FIG. 10, remote unit 1020 is shown as a mobile telephone, remote unit 1030 is shown as a portable computer, and remote unit 1050 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 10 illustrates remote units according to the aspects of the disclosure, the disclosure is not limited to these exemplary illustrated units. Aspects of the disclosure may be suitably employed in many devices, which include the disclosed nested transformer devices.

Figure 11:
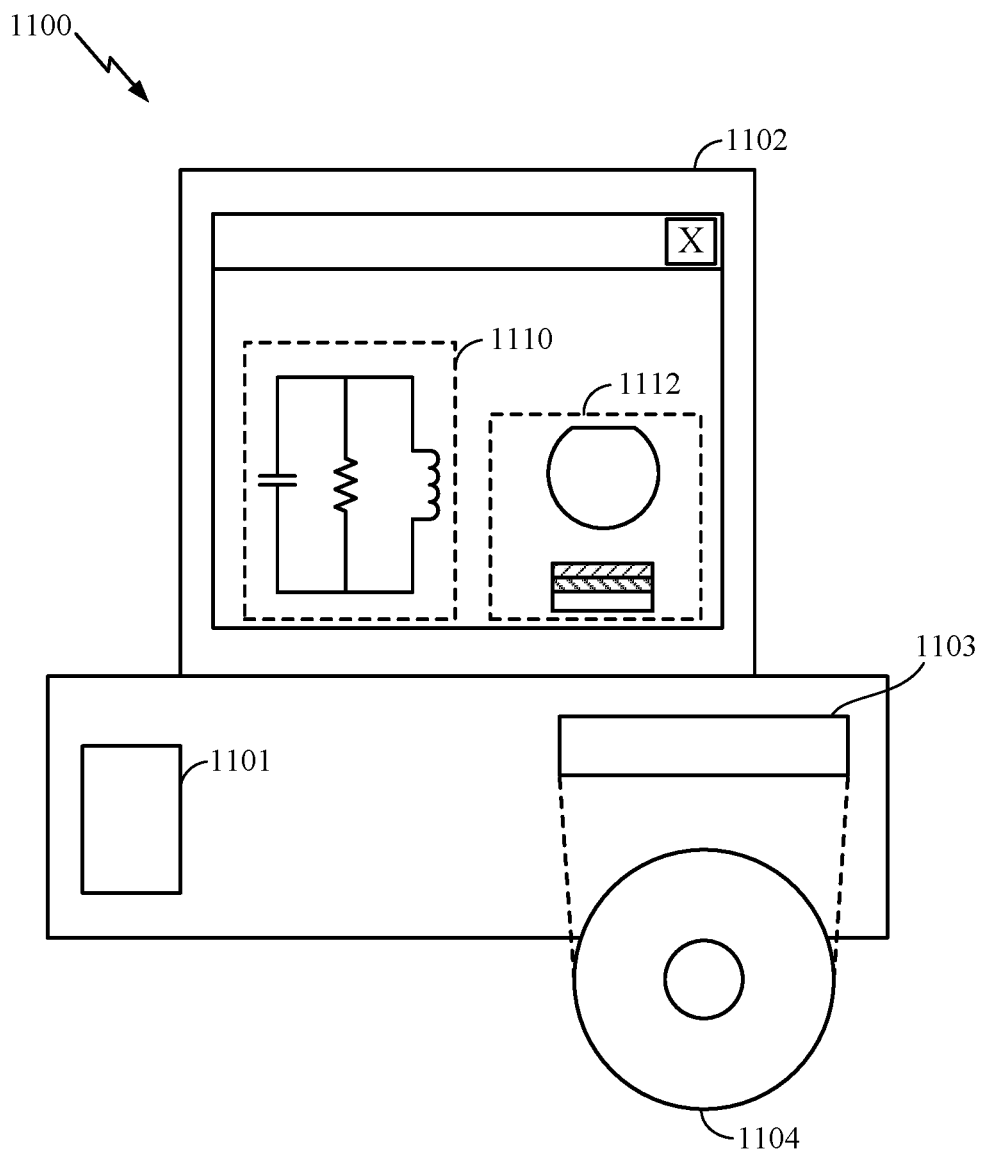
FIG. 11 is a block diagram illustrating a design workstation used for circuit, layout, and logic design of a semiconductor component according to one configuration.

FIG. 11 is a block diagram illustrating a design workstation used for circuit, layout, and logic design of a semiconductor component, such as the nested transformer devices disclosed above. A design workstation 1100 includes a hard disk 1101 containing operating system software, support files, and design software such as Cadence or OrCAD. The design workstation 1100 also includes a display 1102 to facilitate design of a circuit 1110 or a semiconductor component 1112 such as a nested transformer device. A storage medium 1104 is provided for tangibly storing the design of the circuit 1110 or the semiconductor component 1112. The design of the circuit 1110 or the semiconductor component 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit 1110 or the semiconductor component 1112 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A method of fabricating a 3D nested transformer, comprising:
    forming a plurality of through substrate vias in a substrate having a first surface and an opposite second surface; and
    daisy chaining the through substrate vias together with a plurality of traces, at least some of the plurality of through substrate vias having first and second conductive regions, in which the first conductive regions comprise inner cores of the plurality of through substrate vias and the second conductive regions comprise outer shells of the plurality of through substrate vias, the daisy chaining performed by:
        coupling, on the first surface and the second surface of the substrate, a first trace of a first set of traces corresponding to a primary winding to an inner core of a first through substrate via of the plurality of through substrate vias and to an inner core of a second through substrate via of the plurality of through substrate vias,
        coupling, on each of the first surface and the second surface of the substrate, a second trace of a second set of traces corresponding to a secondary winding to an outer shell of the first through substrate via and to an outer shell of the second through substrate via, and
        removing an isolation material deposited between the inner core and the outer shell of the first through substrate via and between the inner core and the outer shell of the second through substrate via.

2. The method of claim 1, further comprising arranging the plurality of through substrate vias in a solenoid manner.

3. The method of claim 1, further comprising positioning at least three connections inside at least one of the plurality of through substrate vias.

4. The method of claim 1, further comprising coupling the first set of traces and the second set of traces by the plurality of through substrate vias in a serpentine manner.

5. The method of claim 1, further comprising:
    arranging the first set of traces on the opposing first and second surfaces of the substrate; and
    arranging the second set of traces on the first set of traces.

6. The method of claim 1, further comprising depositing a dielectric layer between the first set of traces and the second set of traces.

7. The method of claim 1, further comprising arranging the first set of traces and the first conductive regions of the plurality of through substrate vias as a first 3D solenoid inductor.

8. The method of claim 7, further comprising arranging the second set of traces and the second conductive regions of the through substrate vias as a second 3D solenoid inductor nested with the first 3D solenoid inductor to operate as the 3D nested transformer.

9. The method of claim 1, further comprising integrating the 3D nested transformer into a mobile phone, a set top box, a music player, a video player, an entertainment unit, a navigation device, a computer, a hand-held personal communication systems (PCS) unit, a portable data unit, and/or a fixed location data unit.

10. A method of fabricating a 3D nested transformer, comprising:
the step for forming a plurality of through substrate vias in a substrate having a first surface and an opposite second surface; and
the step for daisy chaining the through substrate vias together with a plurality of traces, at least some of the plurality of through substrate vias having first and second conductive regions, in which the first conductive regions comprise inner cores of the plurality of through substrate vias and the second conductive regions comprise outer shells of the plurality of through substrate vias, the daisy chaining performed by:
the step for coupling, on each of the first surface and the second surface of the substrate, a first trace of a first set of traces corresponding to a primary winding to an inner core of a first through substrate via of the plurality of through substrate vias and to an inner core of a second through substrate via of the plurality of through substrate vias,
the step for coupling, on each of the first surface and the second surface of the substrate, a second trace of a second set of traces corresponding to a secondary winding to an outer shell of the first through substrate via and to an outer shell of the second through substrate via, and
the step for removing an isolation material deposited between the inner core and the outer shell of the first through substrate via and between the inner core and the outer shell of the second through substrate via.

11. The method of claim 10, further comprising the step for arranging the plurality of through substrate vias in a solenoid manner.

12. The method of claim 10, further comprising the step for positioning at least three connections inside at least one of the plurality of through substrate vias.

13. The method of claim 10, further comprising the step for coupling the first set of traces and the second set of traces by the plurality of through substrate vias in a serpentine manner.

14. The method of claim 10, further comprising:
the step for arranging the first set of traces on the opposing first and second surfaces of the substrate; and
the step for arranging the second set of traces on the first set of traces.

15. The method of claim 10, further comprising the step for depositing a dielectric layer between the first set of traces and the second set of traces.

16. The method of claim 10, further comprising the step for arranging the first set of traces and the first conductive regions of the plurality of through substrate vias as a first 3D solenoid inductor.

17. The method of claim 16, further comprising the step for arranging the second set of traces and the second conductive regions of the through substrate vias as a second 3D solenoid inductor nested with the first 3D solenoid inductor to operate as the 3D nested transformer.

18. The method of claim 10, further comprising the step of integrating the 3D nested transformer into a mobile phone, a set top box, a music player, a video player, an entertainment unit, a navigation device, a computer, a hand-held personal communication systems (PCS) unit, a portable data unit, and/or a fixed location data unit.

19. A method of fabricating a 3D nested transformer, the method comprising:
forming a cavity in a substrate having a first surface and an opposite second surface;
depositing and patterning a first photoresist layer on the substrate as a patterned first photoresist layer;
plating the substrate and sidewalls of the cavity with a first conductive layer along the patterned first photoresist layer;
stripping the patterned first photoresist layer;
depositing an isolation layer on the plated first conductive layer in the cavity;
etching the deposited isolation layer to provide a core cavity;
depositing and patterning a second photoresist layer on the etched isolation layer as a patterned second photoresist layer;
plating the core cavity and the etched isolation layer with a second conductive layer along the patterned second photoresist layer, in which the first conductive layer comprises an inner core of a first through substrate via and the second conductive layer comprises an outer shell of the first through substrate via;
fabricating a first trace corresponding to a primary winding on the substrate, the first trace coupled, on each of the first surface and the second surface of the substrate, to the outer shell of the first through substrate via and to an outer shell of a second through substrate via;
fabricating a second trace corresponding to a secondary winding on the substrate, the second trace coupled to the inner core of the first through substrate via and an inner core of the second through substrate via; and
removing the etched isolation layer between the inner core and the outer shell of the first through substrate via and between the inner core and the outer shell of the second through substrate via.

20. The method of claim 19, in which depositing the first trace further comprises:
depositing a dielectric material on the first trace; and
depositing and patterning a conductive material on the dielectric material as the second trace.

21. The method of claim 19, further comprising integrating the 3D nested transformer into a mobile phone, a set top box, a music player, a video player, an entertainment unit, a navigation device, a computer, a hand-held personal communication systems (PCS) unit, a portable data unit, and/or a fixed location data unit.

* * * * *